United States Patent [19]

Jaume et al.

[11] Patent Number: 5,060,047
[45] Date of Patent: Oct. 22, 1991

[54] HIGH VOLTAGE SEMICONDUCTOR DEVICE

[75] Inventors: Denis Jaume, Colomiers; Andre P. Lavigne, Lacroix Falgarde; Georges Charitat, Luzech, all of France

[73] Assignee: Motorola, Inc., Schaumburg, Ill.

[21] Appl. No.: 630,804

[22] Filed: Dec. 24, 1990

Related U.S. Application Data

[63] Continuation of Ser. No. 437,404, Nov. 16, 1989, abandoned.

[30] Foreign Application Priority Data

Jul. 21, 1989 [FR] France .................. 89 09897

[51] Int. Cl.⁵ .............................. H01L 29/36
[52] U.S. Cl. ....................... 357/53; 357/34; 357/59; 357/54; 357/71; 357/48; 357/49
[58] Field of Search ............ 357/53, 34, 52, 59, 357/47, 48, 49, 71, 51

[56] References Cited

U.S. PATENT DOCUMENTS

| | | | |
|---|---|---|---|
| 4,409,606 | 10/1983 | Wagenaar et al. | 357/52 |
| 4,419,685 | 12/1983 | Sugawara et al. | 357/53 |
| 4,516,147 | 5/1985 | Koniatsu et al. | 357/59 H |
| 4,583,106 | 4/1986 | Anantha et al. | 357/59 H |
| 4,647,958 | 3/1987 | Gardner | 357/59 H |
| 4,805,004 | 2/1989 | Gandolf et al. | 357/53 |
| 4,879,252 | 11/1989 | Komatsu | 357/34 |

*Primary Examiner*—Rolf Hille
*Assistant Examiner*—Tan Ho
*Attorney, Agent, or Firm*—Joe E. Barbee; Robert M. Handy

[57] ABSTRACT

This invention relates to a high voltage semiconductor device comprising: a substrate (44); an epitaxial region (46) on said substrate including a doped electrode region (48) and a doped isolation region (50), said doped electrode region and said doped isolation region being separated by a first distance (54); an isolation layer (56) on part of said epitaxial region between said doped isolation region and said doped electrode region, said isolation layer covering a portion of the end of said doped electrode region; a first polycrystalline semiconductor layer (60) on said isolation layer; and a metallization layer (68,74), said high voltage semiconductor device being characterized by: a second polycrystalline semiconductor layer (40) on said first polycrystalline semiconductor layer.

20 Claims, 2 Drawing Sheets

— PRIOR ART —

HIGH VOLTAGE SEMICONDUCTOR DEVICE

This application is a continuation of prior U.S. application Ser. No. 07/437,404, filed Nov. 16, 1989, now abandoned.

FIELD OF THE INVENTION

This invention relates to high voltage power semiconductor devices such as power transistors and a process for fabricating such devices. In particular, this invention relates to a process which uses resistive field plate semiconductor technology.

BACKGROUND OF THE INVENTION

Ideally, for power semiconductor devices, such as power transistors, it is desirable that the devices can operate at high voltages which are close to the theoretical breakdown voltage of the semiconductor. However, it is inevitable that during the manufacturing process defects in the semiconductor will be induced which will affect the semiconductor properties (e.g. carrier lifetime, recombination velocity, mobility, etc.) and the resulting device properties. As a result the measured voltage at which breakdown occurs is considerably less than the theoretical breakdown voltage. Thus, the operating voltage of such devices is limited which can be significant for power devices which are required in some applications to operate up to voltages of between 800-900 volts.

Silicon is the most commonly used semiconductor so for convenience of explanation, the description continues using silicon as an exemplary semiconductor material.

A number of methods have been developed in order to increase the measured breakdown voltage capabilities of power devices using planar technology. One of these methods involves processing a device having a guard ring: that is an auxiliary electrode. Such a process is well known in the art. In a NPN transistor, for example, a P+ guard ring is produced during a P+ diffusion step and is positioned so that there is a well defined space between it and the collector electrode of the NPN transistor. The guard ring decreases the electric field at the collector-base junction and thereby increases the high voltage capability of the device. However, devices which are produced by this process have maximum operating voltages which are typically about 70% that of the theoretical breakdown voltage.

Another known method which increases the voltage capabilities of power devices by using guard rings requires an additional base drive processing step at a very high temperature, for example over 1200° C. However, this method requires two additional process steps and a temperature domain which introduces crystal defects and a variation in the minority carrier lifetime.

All the methods which use guard rings have a disadvantage in that each guard ring increases the size of the die by as much as 10%-15%. In addition, problems can arise when processing the guard ring since it is extremely important that the space between the collector-base junction and the guard ring is clearly defined in order that the electric field can be sufficiently decreased. A further disadvantage with this method is that the measured voltage at which breakdown occurs is still less than the theoretical breakdown voltage.

A different method which addresses the problem of increasing the voltage capabilities of high voltage power devices requires the use of a field plate. In this case, the devices have a metal plate such as aluminium metal deposited on an isolation oxide. The aluminium plate is etched away so that it extends across only a portion of the isolation oxide near the collector-base junction thereby reducing the junction curvature effect: that is, the curving of the equipotential lines around the collector-base junction. However, at the edge of the aluminium plate the equipotential lines tend to converge and hence the electric field is increased. Silicon oxide is most commonly used because of its excellent compatibility with silicon.

Experiments have shown for such a field plate device that there exists a relationship between the minimum silicon oxide thickness and the resistivity of the semiconductor expitaxial layer in order to obtain the breakdown voltage. Against this, it is also important that the silicon oxide thickness between the collector-base junction and the edge of the aluminium plate is optimised to reduce the electric field at the edge of the aluminium plate. Taking account of these two conflicting requirements the optimum value for such a parameter is known by experiment. However, devices which are produced by this process have maximum operating voltages which are typically only about 60% that of the theoretical breakdown voltage.

A known improvement which utilises a resistive field plate method has been developed. This is similar to the field plate method, however, a semi-insulating polycrystalline semiconductor, such as polycrystalline silicon (SIPOS), is deposited on the silicon oxide which has been exposed by etching away the aluminium plate. Devices produced by such a process can support higher operating voltages, however, such devices suffer from a new problem which is known as the walk out effect.

The walk out effect produces a gradual variation in the measured breakdown voltage which affects the stability of the devices. In order to overcome the effects due to walk out, an additional dielectric layer is deposited using high temperature Chemical Vapour Deposition (CVD) on top of the SIPOS. Typically this second layer may comprise silicon oxide, silicon nitride or phosphosilicate glass. However, although having a CVD second layer reduces the walk out effect, the high resistivity of such a layer compromises the field plate effect and as a result considerably reduces the operating voltage capabilities of the semiconductor power device.

SUMMARY OF THE INVENTION

Thus, it is an object of the present invention to provide an improved high voltage power semiconductor device and an improved process for fabricating such a device wherein the above disadvantages are obviated.

In accordance with a first aspect of the present invention there is provided a high voltage semiconductor device comprising:

a substrate;

an epitaxial region on said substrate including a doped electrode region and a doped isolation region, said doped electrode region and said doped isolation region being separated by a first distance;

an isolation layer on part of said epitaxial region between said doped isolation region and said doped electrode region, said isolation layer covering a portion of the end of said doped electrode region;

a first polycrystalline semiconductor layer on said isolation layer; and a metallization layer, said high voltage semiconductor device being characterised by:

a second polycrystalline semiconductor layer on said first polycrystalline semiconductor layer.

In accordance with a second aspect of the present invention there is provided a process for fabricating a high voltage semiconductor device comprising the steps:

providing a substrate;

forming an epitaxial region on said substrate;

forming a first doped electrode region in said epitaxial region;

forming a second doped electrode region in said first doped electrode region and a doped isolation region in said epitaxial region;

forming an isolation layer on said epitaxial region; the process being characterised by the following steps:

depositing first and second polycrystalline semiconductor layers on said isolation layer;

forming first, second and third openings in the first and second polycrystalline semiconductor layers and said isolation layer;

depositing a metallization layer on said second polycrystalline semiconductor layer and said epitaxial region;

etching said metallization layer to form first, second and third metallization portions in said first, second and third openings, said second metallization portion extending a small distance from the end of said doped electrode region across said second polycrystalline semiconductor layer.

Thus, since the field plate is used in conjunction with a polycrystalline silicon plate having two layers, the resistivity of the second layer being much larger than the first layer, semiconductor devices according to the invention have the capability to sustain voltages between 800-900 volts whilst eliminating the walk out effect.

One high voltage semiconductor device and process for its fabrication will now be described, by way of example only, with reference to the accompanying drawings in which:

DESCRIPTION OF THE PREFERRED EMBODIMENT

In the description that follows and in FIGS. 3-10, certain regions are identified as being of particular material, conductivity and/or type. However, this is merely for convenience of explanation and not intended to be limiting. Those of skill in the art will understand based on the description given herein that various semiconductor and dielectric materials can be used and that the doping of various regions of the semiconductor substrate may be altered in order to obtain different device functions.

Figure 1:
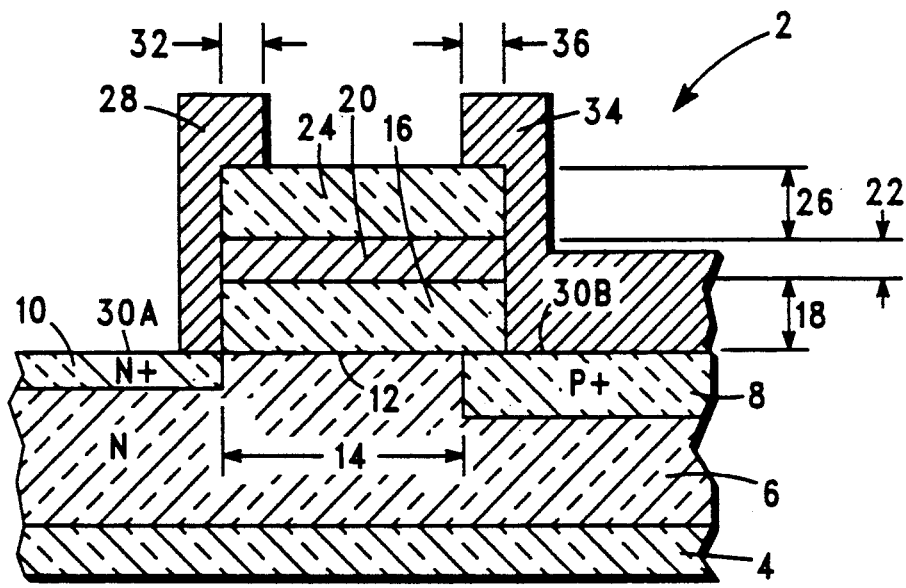
FIG. 1 shows a simplified schematic cross-sectional view of a portion of a substrate of a prior art high voltage semiconductor device.

In a simplified cross-section of a portion 2 of a semiconductor substrate of a prior art high voltage semiconductor transistor device illustrated in FIG. 1, the high voltage NPN transistor 2 comprises a substrate 4, a n-type epitaxial region 6 having two oppositely doped regions 8 and 10 buried therein and having a surface 12. Doped regions 8 and 10 are separated by a distance 14 which may typically be 200 $\mu$m.

Doped region 8 has a higher concentration of acceptor atoms (i.e. P+) and forms the base electrode of the high voltage transistor (not shown). Region 10 is doped with a high concentration of donor atoms and forms the isolation channel for providing electrical isolation between different circuit components. Means for forming such layers and regions are conventional and well known in the art.

A hard mask 16 is formed on the epitaxial region 6 such that it extends over the open surface 12 of the epitaxial region between the isolation channel 10 and a portion of the base electrode region 8. It is essential that mask 16 is resistant to materials that etch epitaxial semiconductor region 6 whilst also being resistant to oxidation. Such mask materials are well known in the art. However, mask 16 is conveniently formed from thermally grown silicon oxide having a typical thickness 18 of 300 nm.

A semi-insulating polycrystalline semiconductor layer 20 is formed on the mask 16 by CVD, Low Pressure CVD (LPCVD) or other processes well known in the art and with a thickness 22 in the range of 400 nm-600 nm. Typically, polycrystalline silicon (SIPOS) having 12% concentration of oxygen is used. The percentage of oxygen determines the resistivity, which for 12% is around $10^8 \Omega$cm, and dielectric constant which is near 10, and thus the operating voltage of the high voltage transistor. The SIPOS having the required percentage concentration is obtained by LPCVD at temperatures of between 540° C. and 680° C. using the reaction between silane (SIH$_4$) and nitrogen protoxyde (N$_2$O).

The polycrystalline silicon layer 20 forms the resistive field plate in cooperation with a metallization layer. In order to reduce the effects due to walk out which arises with such a resistive field plate a dielectric layer 24 is formed on the polycrystalline silicon layer 20 by high temperature CVD. The dielectric layer 24 has a thickness 26 in the range 500 nm-1000 nm and may comprise thermal silicon oxide, silicon nitride, phosphosilicate glass or any combination thereof.

The metallization layer, which is generally aluminium, is deposited using vacuum deposition onto the dielectric layer 24 and the exposed portions 30A-B of the epitaxial semiconductor region 6. An etching process is used to leave one portion 28 covering part of the isolation channel 10 and extending a small distance 32 across the surface of the dielectric layer 24. Another portion of the metallization layer, only part 34 of which is shown, covers the base electrode 8 of the epitaxial semiconductor layer and extends a small distance 36 across the surface of the dielectric layer 24.

The dielectric layer 24 protects the epitaxial region from the external environment such as moisture in the atmosphere and provides for better stability by reducing the walk out effect. However, due to capacitance produced at the interface of the dielectric layer 24 and the polycrystalline silicon layer 20, dielectric layer 24 reduces the operating voltage capability by 20% or more.

In addition, at the interface between the silicon oxide and the polycrystalline layer 20 the interfacial charges have a high rate of dispersion and as a result introduce a limitation on the voltage capability.

Figure 2:
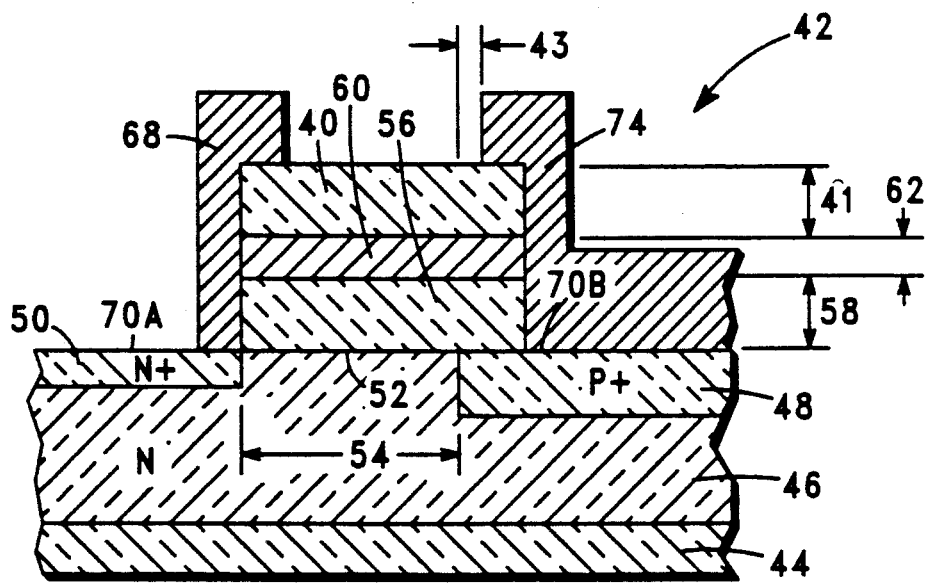
FIG. 2 shows a simplified schematic cross-sectional view of a portion of a substrate of a high voltage semiconductor device in accordance with the present invention.

Referring now to FIG. 2, in a preferred embodiment of the present invention in order to improve the operating voltage capability of a high voltage transistor, only part 42 of which is shown, a second polycrystalline silicon layer 40 is deposited on a first SIPOS layer 60. The structure of the substrate of FIG. 2 is similar to that of FIG. 1 and like components in FIG. 2 are referenced with numerals which are the same as FIG. 1 plus the number forty.

The portion 42 of the high voltage transistor comprises a substrate 44, a n-type epitaxial region 46 on the substrate having a doped isolation channel 50 and a doped base electrode 48, a silicon oxide mask 56 and aluminium layer with portions 68 and 74. The silicon oxide mask is formed so that is covers the open surface 52 of the epitaxial region 46 and part of the doped base electrode 48. A first polycrystalline silicon layer 60 is deposited on the silicon oxide mask 56 by LPCVD and using the same apparatus and following on from the first deposition a second polycrystalline silicon layer 40 is deposited on the first polycrystalline layer. The aluminium portions 68 and 74 are formed in an identical manner to that described above with reference to FIG. 1.

Since a second polycrystalline silicon layer 40 is deposited on the first polycrystalline silicon layer 60, the interface problems which arise between the polycrystalline silicon layer 20 and dielectric layer 24 of FIG. 1 are obviated. That is, the voltage loss due to the interface capacitance is eliminated due to the compatibility of the two layers.

In addition to having a second polycrystalline silicon layer to improve the operating voltage capability, it is important that certain parameters are optimised in order to achieve operating voltages in the range of 85% to 95% of the theoretical breakdown voltage.

The breakdown voltage capability is dependent on the thickness 58 of the thermal silicon oxide layer 56 and is optimum when the thickness is between 800 nm and 1200 nm. This results from the fact that a larger area is needed to sustain a higher breakdown voltage.

The first polycrystalline silicon (SIPOS) layer 60 is arranged to have a 12% oxygen content and a thickness 62 in the range of 300 nm to 500 nm. It is important that the second dielectric layer has a high resistivity value in order to control the walk out effect and reduce leakage current. Therefore, the second polycrystalline silicon layer 40 is arranged to have a oxygen content in the range of between 25% and 30%. This can conveniently be obtained by using the same LPCVD tube and the same run but changing the proportions of the reactants. The result is a polycrystalline silicon layer having a resistivity higher than $10^{11}$ $\Omega$cm. The optimised thickness 41 for the second polycrystalline silicon layer 40 is in the range of 150 nm–300 nm.

Thus, it will be appreciated that by using a second polycrystalline silicon layer 40, in addition to avoiding interface capacitance, also means that it is unnecessary to use another LPCVD tube which is the case when a silicon oxide, silicon nitride or phosphosilicate glass dielectric is used. The first and second polycrystalline silicon layers between the base electrode and the isolation channel 50 acts as a field plate such that the equipotential lines are caused to spread between the edge of the aluminium portion 68 and the isolation channel 50.

Thus, reducing the electric field at the collector-base junction.

The breakdown voltage is also dependent on the geometry of the field plate: that is, the geometry of the aluminium portions 68 and 74. The maximum measured breakdown voltage is obtained when the optimum distance 43 measured from the edge of the doped base electrode 48 to the edge of the aluminium portion 74 is in the range of 40 $\mu$m to 120 $\mu$m. In this range the measured breakdown voltage is due to the bulk silicon avalanche effect. It is also important that the distance 54 between the doped P+ base electrode 48 and the doped isolation channel 50 is in the range 150 $\mu$m to 25 $\mu$m since if distance 54 is less than 150 $\mu$m, the breakdown voltage decreases due to surface field effect breakdown.

A process for fabricating a high voltage transistor device according to the present invention will now be described with reference to FIGS. 3–10.

Figure 3:
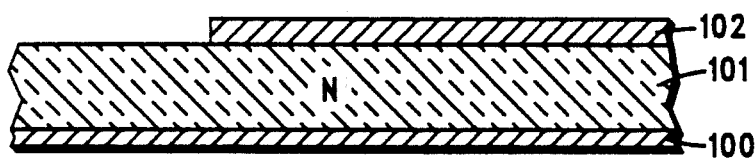
FIGS. 3-10 show simplified schematic cross-sectional views of a portion of a semiconductor substrate during different stages of fabrication and according to the present invention.
Figure 4:
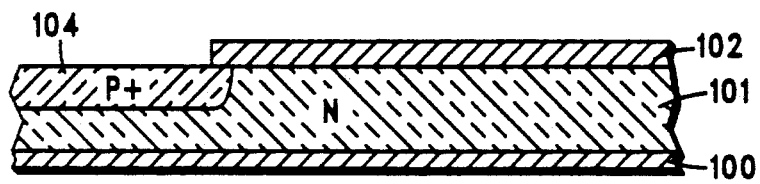
Figure 5:
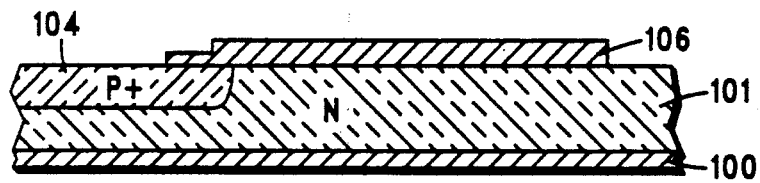
Figure 6:
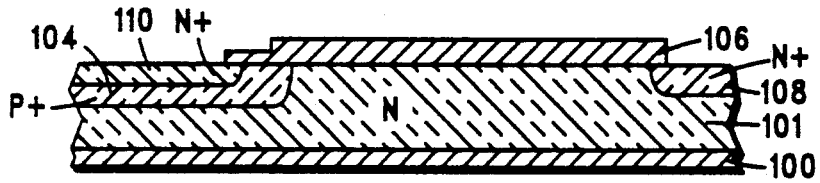

In FIG. 3 the process is commenced by having a substrate 100 on which an epitaxial region 101 is grown. The epitaxial region 101, which may comprise n-type silicon, is then selectively masked with a silicon oxide mask 102. Next a doped region 104 is formed by diffusion in a predetermined unmasked portion of the epitaxial region 101. The region 104 is doped with a P+ conductivity type.

Once doped region 104 which acts as the base electrode of the transistor has been formed the epitaxial region 101 is masked by a new silicon oxide mask 106. Next two predetermined regions 108 and 110, of respectively the epitaxial region 101 and the P+ doped region 104, are formed by diffusion with an N+ conductivity type. The N+ doped region 110 formed in the P+ region 104 forms an emitter electrode of the transistor and the N+ doped region 108 forms an isolation channel.

Figure 7:
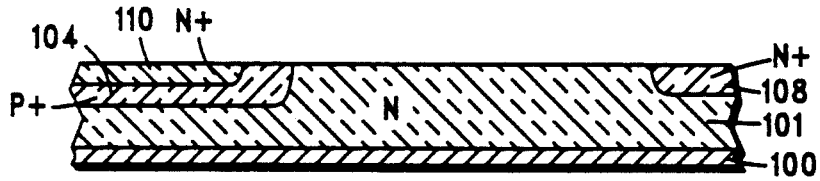
Figure 8:
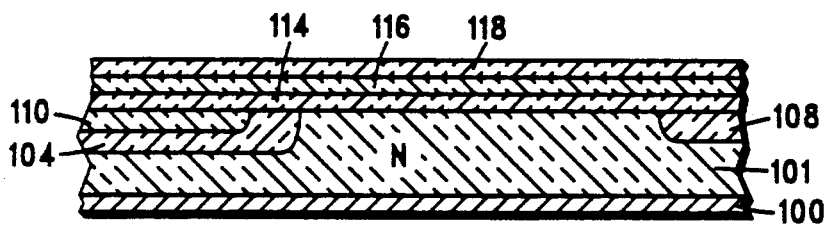
Figure 9:
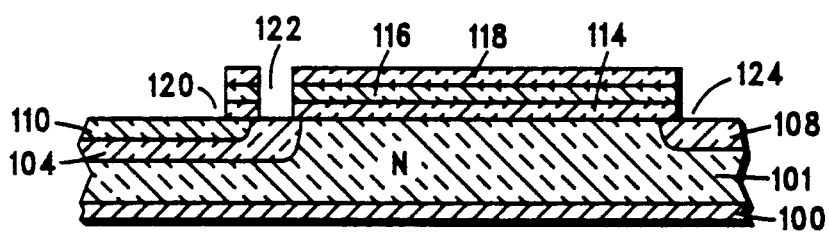

Following the formation of the emitter electrode 110 and the isolation channel 108, new mask 106 is removed, FIG. 7. Next a hard mask 114 having a predetermined thickness is formed on the epitaxial region 101. This mask 114 is conveniently formed from thermally grown silicon oxide by a method well-known in the art. Once the silicon oxide mask 114 has been formed, a first polycrystalline silicon layer 116, having 12% concentration of oxygen and a predetermined thickness, followed by a second polycrystalline silicon layer 118, having 30% concentration of oxygen and a predetermined thickness, are deposited on the silicon oxide mask 114. The first 116 and second 118 polycrystalline silicon layers are formed on the mask 114 by LPCVD in one run at temperatures of between 540° C. and 680° C. using the reaction between silane (SIH$_4$) and nitrogen protoxyde (N$_2$O).

Figure 10:
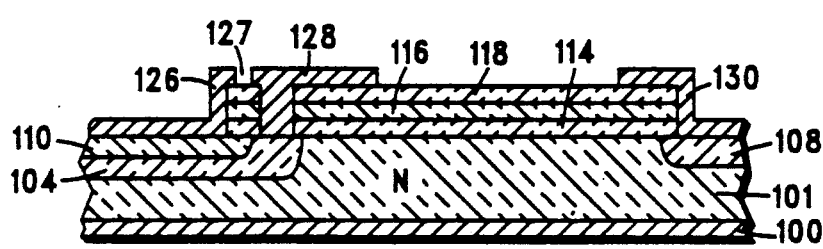

First 120, second 122 and third 124 openings are now formed. All three openings extend to epitaxial region 101. The first opening 120 being disposed over the N+ emitter electrode 110, the second opening 122 being disposed over the P+ base electrode 104 and the third opening 124 being disposed over the N+ isolation channel 108. Next a metallization layer such as aluminium is deposited using vacuum deposition onto the second polycrystalline layer 118 and the exposed epitaxial region 101. An etching process follows to etch away all undesired aluminium areas whereby a portion 126 is formed in the first opening 120 and extends a small distance across the second polycrystalline silicon layer 118. A second portion 128 is formed in the second opening 122 such that it extends a small distance, between 40

μm and 120 μm, across the second polycrystalline silicon layer 118 which covers the region between the base electrode 104 and isolation channel 108 and is separated from the first portion 126 by a space 127. A third portion 130 is formed in the third opening 124 and extends a small distance across the second polycrystalline layer 118 towards the second aluminium portion 128 as shown in FIG. 10.

Thus, a process for fabricating a high voltage transistor in accordance with the present invention has been described. The process steps such as masking, doping by diffusion, means for epitaxy of semiconductor materials are well-known in the art.

In summary, by using a second polycrystalline semiconductor layer in order to eliminate the effects due to walk out and by optimising the geometry and electrical properties of the high voltage planar structure, a high voltage semiconductor device is obtained using a resistive field plate technique.

It will be appreciated by persons skilled in the art that although the specific example described herein relates to a high voltage bipolar transistor device, the invention is not limited thereto and can be utilised in all high voltage MOS and bipolar semiconductor devices, such as transistors and rectifiers.

We claim:

1. A semiconductor device comprising:
   a substrate;
   a semiconductor region on the substrate including a doped electrode region and a doped isolation region, wherein the doped electrode region and the doped isolation region are separated by a first distance;
   an isolation layer on part of the semiconductor region between the doped isolation region and the doped electrode region, the isolation layer covering a portion of an end of the doped electrode region;
   a first polycrystalline semiconductor layer of a first resistivity on the isolation layer;
   a second polycrystalline semiconductor layer of a second resistivity different than the first resistivity on the first polycrystalline semiconductor layer, wherein the second resistivity exceeds the first resistivity; and
   a metallization layer extending at least partly over the second polycrystalline semiconductor layer.

2. The semiconductor device of claim 1 wherein the first resistivity is greater than or equal to about $10^8$ ohm-cm.

3. The semiconductor device of claim 2 wherein the second resistivity is is greater than or equal to about $10^{11}$ ohm-cm.

4. The semiconductor device of claim 1 wherein the first distance is in the range of about 150–225 micrometers.

5. A semiconductor device comprising:
   a substrate;
   a semiconductor region on the substrate including a doped electrode region and a doped isolation region, wherein the doped electrode region and the doped isolation region are separated by a first distance;
   an isolation layer on part of the semiconductor region between the doped isolation region and the doped electrode region, the isolation layer covering a portion of an end of the doped electrode region;
   a first polycrystalline semiconductor layer of a first resistivity on the isolation layer;
   a second polycrystalline semiconductor layer of a second resistivity different than the first resistivity on the first polycrystalline semiconductor layer; and
   a metallization layer extending at least partly over the second polycrystalline semiconductor layer, wherein the first and second polycrystalline semiconductor layers comprise silicon having, respectively, first and second percentage concentrations of oxygen 6. The semiconductor device of claim 5 wherein the first polycrystalline semiconductor layer comprises polycrystalline silicon with about 12% oxygen.

7. The semiconductor device of claim 5 wherein the second polycrystalline semiconductor layer comprises polycrystalline silicon with about 25–30% oxygen.

8. A semiconductor device comprising:
   a substrate;
   a semiconductor region on the substrate including a doped electrode region and a doped isolation region, wherein the doped electrode region and the doped isolation region are separated by a first distance;
   an isolation layer on part of the semiconductor region between the doped isolation region and the doped electrode region, the isolation layer covering a portion of an end of the doped electrode region;
   a first polycrystalline semiconductor layer of a first resistivity on the isolation layer;
   a second polycrystalline semiconductor layer of a second resistivity different than the first resistivity on the first polycrystalline semiconductor layer; and
   a metallization layer extending at least partly over the second polycrystalline semiconductor layer, wherein the first polycrystalline semiconductor layer has a first thickness and the second polycrystalline semiconductor layer has a second thickness less than the first thickness.

9. The semiconductor device of claim 8 wherein the first and second thicknesses are in the ratio of about 2:1.

10. The semiconductor device of claim 9 wherein the second thickness is in the range of about 150–300 nanometers.

11. A semiconductor device comprising:
    a substrate;
    a semiconductor region on the substrate including a doped electrode region and a doped isolation region, wherein the doped electrode region and the doped isolation region are separated by a first distance;
    an isolation layer on part of the semiconductor region between the doped isolation region and the doped electrode region, the isolation layer covering a portion of an end of the doped electrode region;
    a first polycrystalline semiconductor layer of a first resistivity on the isolation layer;
    a second polycrystalline semiconductor layer of a second resistivity different than the first resistivity on the first polycrystalline semiconductor layer; and
    a metallization layer extending at least partly over the second polycrystalline semiconductor layer, wherein the metallization layer has a first part that contacts part of the doped isolation region and extends partly across the second polycrystalline semiconductor layer beyond the doped isolation region.

12. The semiconductor device of claim 11 wherein the metallization layer has a second part which contacts the doped electrode region and extends partly over the second polycrystalline semiconductor region to within about 40-120 micrometers of the end of the doped electrode region.

13. The semiconductor device of claim 12 wherein the first and second parts of the metallization are separated by a portion of the second polycrystalline semiconductor layer.

14. An electronic device comprising a single crystal semiconductor having first and second oppositely doped regions extending to a principal surface of the semiconductor and separated at the surface by a first distance, a dielectric on the principal surface extending at least between the first and second doped regions, a first oxygen doped polycrystalline semiconductor over the dielectric, and a second more heavily oxygen doped polycrystalline semiconductor over the first oxygen doped polycrystalline semiconductor.

15. The device of claim 14 further comprising a metallization having a first part contacting the first doped region and extending partly above the second oxygen doped polycrystalline semiconductor and a separate second part contacting the second doped region and extending partly above the second oxygen doped polycrystalline semiconductor.

16. The device of claim 15 wherein the first part of the metallization extends over the second oxygen doped polycrystalline semiconductor but not beyond an end of the first doped region facing the second doped region.

17. The device of claim 14 wherein the first oxygen doped polycrystalline semiconductor has a resistivity of at least about $10^8$ ohm-cm and the second oxygen doped polycrystalline semiconductor has a resistivity of at least about $10^{11}$ ohm-cm.

18. An electronic device comprising a single crystal semiconductor having first and second oppositely doped regions extending to a principal surface of the semiconductor and separated at the surface by a first distance, a dielectric on the principal surface extending at least between the first and second doped regions, a first oxygen doped polycrystalline semiconductor over the dielectric, and a second oxygen doped polycrystalline semiconductor over the first oxygen doped polycrystalline semiconductor, and wherein the first part of the metallization extends over the second oxygen doped polycrystalline semiconductor but not beyond an end of the first doped region facing the second doped region, and wherein the first part of the metallization extends over the second oxygen doped polycrystalline semiconductor to within about 40-120 micrometers of the end of the first doped region.

19. An electronic device comprising a single crystal semiconductor having first and second oppositely doped regions extending to a principal surface of the semiconductor and separated at the surface by a first distance, a dielectric on the principal surface extending at least between the first and second doped regions, a first oxygen doped polycrystalline semiconductor over the dielectric, and a second oxygen doped polycrystalline semiconductor over the first oxygen doped polycrystalline semiconductor, and wherein the first oxygen doped polycrystalline semiconductor has a first percentage of oxygen and the second oxygen doped polycrystalline semiconductor has a higher percentage oxygen.

20. The device of claim 19 wherein the second oxygen doped polycrystalline semiconductor has about 25-30% oxygen.

* * * * *